United States Patent [19]

Hill

[11] Patent Number: 4,776,299

[45] Date of Patent: Oct. 11, 1988

[54] SOURCE REPLENISHMENT DEVICE FOR VACUUM DEPOSITION

[75] Inventor: Ronald A. Hill, Albuquerque, N. Mex.

[73] Assignee: The United States of America as represented by the United States Department of Energy, Washington, D.C.

[21] Appl. No.: 863,331

[22] Filed: May 15, 1986

[51] Int. Cl.$^4$ .............................................. C23C 14/24
[52] U.S. Cl. ..................................... 118/727; 118/726
[58] Field of Search ................................. 118/727, 726

[56] References Cited

U.S. PATENT DOCUMENTS

| | | | |
|---|---|---|---|
| 2,403,199 | 7/1946 | Swope | 118/727 |
| 3,503,368 | 3/1970 | Pudliner | 118/727 |
| 3,563,202 | 2/1971 | Mackrael | 118/727 |
| 3,714,925 | 2/1973 | Helm | 118/727 |
| 4,100,879 | 7/1978 | Goldin | 118/727 |

OTHER PUBLICATIONS

Tzanavaras, IBM Tech. Dis. Bul., vol. 12, No. 11, Apr. 1970.

Primary Examiner—Richard Bueker
Attorney, Agent, or Firm—Anne D. Daniel; James H. Chafin; Judson R. Hightower

[57] ABSTRACT

A material source replenishment device for use with a vacuum deposition apparatus. The source replenishment device comprises an intermittent motion producing gear arrangement disposed within the vacuum deposition chamber. An elongated rod having one end operably connected to the gearing arrangement is provided with a multiarmed head at the opposite end disposed adjacent the heating element of the vacuum deposition apparatus. An inverted U-shaped source material element is releasably attached to the outer end of each arm member whereby said multiarmed head is moved to locate a first of said material elements above said heating element, whereupon said multiarmed head is lowered to engage said material element with the heating element and further lowered to release said material element on the heating element. After vaporization of said material element, second and subsequent material elements may be provided to the heating element without the need for opening the vacuum deposition apparatus to the atmosphere.

10 Claims, 4 Drawing Sheets

SOURCE REPLENISHMENT DEVICE FOR VACUUM DEPOSITION

The U.S. Government has rights in this invention pursuant to Contract No. DE-AC04-76DP00789 between the U.S. Department of Energy and AT&T Technologies, Inc.

BACKGROUND OF THE INVENTION

1. Field of the Invention

This invention relates generally to a method and device to deliver successive pieces of source material to a material heating element in a vacuum deposition apparatus, and particularly to a method and device for replenishing the filament of a vacuum deposition apparatus with source material without opening the apparatus to the atmosphere.

2. History of the Prior Art

The deposition of selected pure metals or other materials possessing particularly desirable properties, generally in the form of very thin films, is a common but very important step in the production of miniaturized electronic components. In fact, it is not uncommon to have the deposition of mor than one material in successive thin film layers on the same substrate, with or without the deliberate but partial elimination of a preceding film before a successive film is deposited thereon.

In the art of vacuum deposition of such source materials on selected substrates, there are several methods of obtaining a flux of vaporized source material atoms. These methods include a heating element heated by its own electrical resistance, heated crucibles or boats that are either self-heated or heated by external means, electron beam vaporization sources, sputtering sources, RF-heated sources, inductively-heated sources, and the like. Each of these techniques has its own advantages and disadvantages, depending primarily upon the geometry and orientation of the substrate, the type of substrate, the source material itself, the coating thickness, the duration for which the coating has to be applied, the purity of the coating material, and the like.

In the field of vapor deposition of thin films using heated filament sources, different geometries are found to be useful in dealing with different types of source material. One solution, particularly suited for the vaporization of aluminum from a tungsten filament, utilizes a multistrand, twined, helical filament for heating the source material. On the other hand, gold can be easily evaporated from a tungsten filament constructed from several turns of solid wire. Where clean vapor deposition of very thin films is desired, e.g., in the tuning of quartz crystal oscillators, it is important that only vapor and no solid or liquid particles should reach the substrate from the source. Such particles may arise, for instance, when gas bubbles escape from the filament or from the source material being vaporized. Precleaning of the heating element, preferably by heating it in a high vacuum, is recommended. Thus, minimizing the exposure of the deposition apparatus and the heating element to air during replenishment of the source material is paramount.

Typically, when the source material is exhausted, vacuum is broken, and another piece of source material is positioned by the operator onto the heating element. The entire system then has to be evacuated and degassed, brought up to working conditions, and the process repeated each time the source material is exhausted. Numerous alternatives, all aimed at providing a more or less continuous supply of source material for vaporization, have been proposed. Each, however, has certain limitations and problems, and it is highly desirable to be able to utilize a simple helical coil heating source to which source material is periodically added without totally disrupting the process. Since substrates are often coated on both sides it is also highly desirable that the replenishment device be small, easy to operate, and one that does not require the location or addition of vacuum ports at awkward positions in the overall apparatus.

Some vacuum deposition apparatus provide for a source material in the form of a wire which is continually fed onto a heated filament. In such an arrangement, the entire feed mechanism must be electrically insulated from the deposition chamber, so as not to "short out" the heating filament. In operation, however, the heating filament is generally nearly white hot and somewhat fragile, so that continuous feeding could result in destruction of the filament. Furthermore, a continuously fed wire would tend to act as a heat sink, so that it could be difficult to continually supply sufficient energy to keep the heating element hot enough to perform its function adequately.

SUMMARY OF THE INVENTION

Accordingly, it is an object of this invention to provide apparatus for replacing vaporizable source material to be vaporized by heating elements inside an apparatus for vacuum deposition of material onto substrates.

A further object of this invention is to provide apparatus, inside a vacuum deposition system, which enables the user to systematically replenish the source material in predetermined amounts without breaking the vacuum of the system itself.

Yet another object of this invention is to provide apparatus inside a vacuum deposition system, for the placing of different source material elements, in predetermined amounts and in a predetermined sequence of materials, onto a single heating element for vaporizing the same for vacuum deposition onto substrates.

An additional object of this invention is to provide a method for sequentially placing vaporizable source materials, in predetermined amounts and of predetermined composition, onto the heating element of a vacuum deposition apparatus without breaking the vacuum of the system and thereby interrupting the process.

These and other benefits of this invention are achieved by providing, in a vacuum deposition system, a mechanism having a rotatable and vertically moveable post or wand, operable from outside the apparatus in a position remote from the heating element, for supporting a plurality of replenishment elements and indexing the elements successively onto the heating element.

The wand has a plurality of lateral arms each supporting a source material element of selected shape, size and composition beneath the heating element. Novel gearing, operable from outside the vacuum deposition apparatus, indexes the arms upwardly above the heating element, rotates the arms until a source element is directly above the heating element, indexes the arms downwardly to pick off a source element on the heating element and further rotates the arms to prepare for the next operation. In this method of operation, it is unnecessary to electrically isolate the wand and associated replenishment material from the heating element. Preferably, the source elements are each in an inverted U-shape, with one leg of each "U" retained in an arm.

In accordance with another aspect of the invention, the linear and rotary motions are preferably obtained by means of a cylindrical cam cooperating with a Geneva drive mechanism. The motion of the wand is thereby controlled by a single rotary drive located outside the vacuum chamber of the deposition apparatus, and such rotary drive may be in a position remote from mechanism driving the wand.

DESCRIPTION OF THE PREFERRED EMBODIMENT

Figure 1:
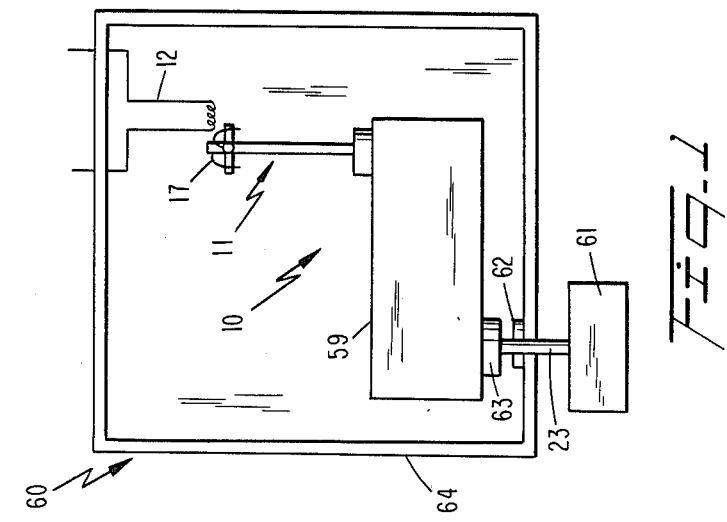
FIG. 1 is a schematic view of the apparatus of this invention within a vacuum chamber.
Figure 3:
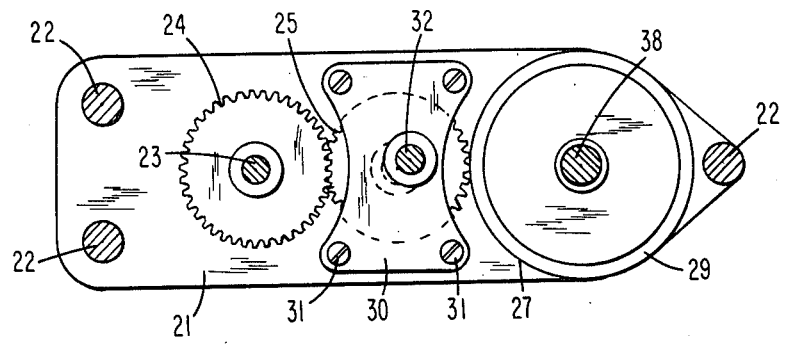
FIGS. 3-6 are plan view taken at sections 3—3 to 6—6, respectively, of FIG. 2.

Referring to FIG. 1 of the drawings, reference character 10 generally indicates a material source replenishment device for vacuum deposition within an airtight vacuum chamber generally indicated by reference character 64 and having a heating element 12 for vaporizing source material so that the vaporized material is deposited in a fine layer on the exposed surface of an object or substrate (not shown) to be plated.

The material source replenishment device 10 comprises a vertically disposed moveable rod or wand mechanism generally indicated by reference character 11 which carries a plurality of material source replenishment elements 17 at the upper end thereof. The device 10 further comprises a motion producing apparatus 59 which is capable of imparting both vertical and rotational movement of the wand apparatus 11 in order to place a succession of material elements 17 onto the heating element 12 in a manner that will be hereinafter set forth. The motion producing apparatus 59 is located inside the vacuum chamber 64 and is driven by an external drive motor and control apparatus 61 located outside the vacuum chamber. The drive and control mechanism 61 is operably connected to the motion producing apparatus 59 by way of a drive shaft 23 extending through the housing 64 by way of a vacuum seal bearing 62.

It is noted at this point that for simplicity a straight shaft 23 has been described connecting the drive means 61 with the motion producing apparatus 59. However, it is noted that this connection may be offset through a chain drive or gear mechanism (not shown) when the configuration of the vacuum apparatus does not permit a straight-through drive as shown.

Figure 7:
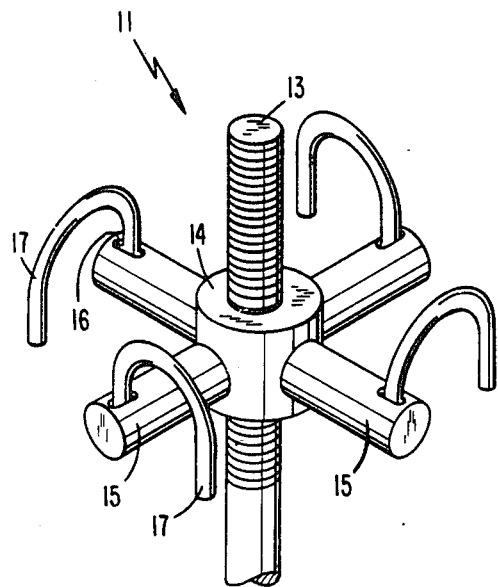
FIG. 7 is a perspective view showing a vertical post or wand having four arms, each carrying an element of source material.

Referring now to FIG. 7 of the drawings, the wand apparatus 11 comprises a vertically disposed rod 13, the upper end of which is threaded for threadedly receiving a collar 14, which in turn is backed with a lock nut (not shown) for positioning collar 14 vertically on the rod 13. A plurality of outwardly extending radially spaced arm members 15 are secured to the collar 14 as shown in FIG. 7. It is noted that although only four such arms 15 are shown, the number of arms may be varied as desired, along with an appropriate redesign of the motion producing apparatus 59.

Each arm 15, at its distal end, is provided with a vertically disposed slot aperture 16, each for carrying one of the material source replenishment elements 17 therein.

Figure 8:
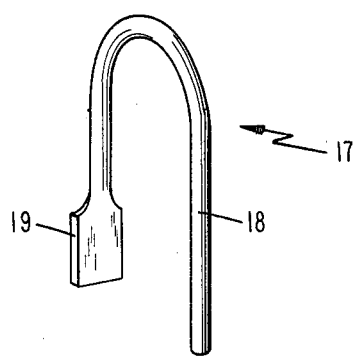
FIG. 8 is a perspective view of a typical piece of source replenishment material.

Referring to FIG. 8, the source replenishment element 17 comprises an inverted U-shaped rod 18 of the desired material. One end of the inverted U-shaped rod 18 is flattened to form a rectangular plate end indicated by reference character 19 which is sized to be slidably carried by the slot 16 at the outer end of arm 15. The flattened end 19, in cooperation with the vertical slot 16, permits each material element 17 to be loosely carried in the slot 16 while not permitting rotation of the element 17 with respect to the arm 15, for a purpose that will be hereinafter set forth.

Before describing the motion producing apparatus 59 in detail, it would be helpful at this point to describe the method or sequence of events leading to the sequential replenishment of source material elements 17 on the heating element 12.

Figure 9A:
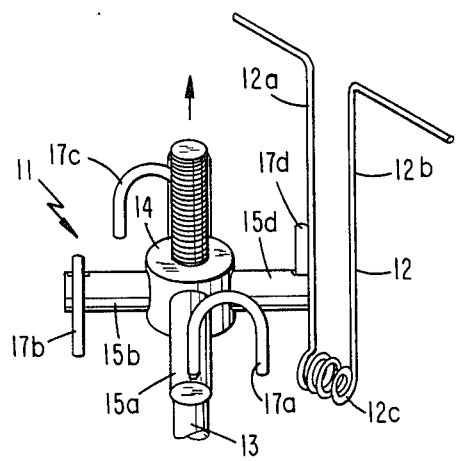
FIGS. 9(a)-9(d) are perspective views of different stages in the operation replenishing the source material elements.

Referring to FIGS. 9(a), (b), (c), and (d) of the drawings, arms 15 have been designated, clockwise, as 15(a), (b), (c), and (d) and having associated source replenishment elements 17(a), (b), (c), and (d), respectively. The heating element 12 comprises vertically disposed parallel lead members 12(a) and (b) connected at the lower end thereof by a horizontally disposed heating element coil indicated by reference character 12(c).

At the beginning of the sequence, power is removed from the heating element 12 and the arms 15 are oriented at 45° with respect to the axis of the heating element 12(c). The rod 13 is then raised from a lowered position (not shown) upwardly to the position shown in FIG. 9(a). It can been seen that arms 15(a) and (d), in essence, straddle heating element lead 12(a).

Figure 9B:
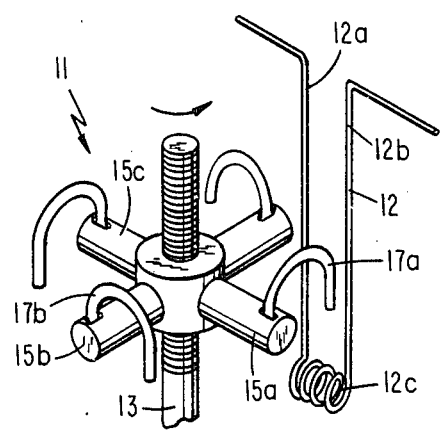

Rod 13 is then rotated in a counterclockwise direction by 45° to the position shown in FIG. 9(b) such that the replenishment element 17(a) is disposed between heating element leads 12(a) and (b) above the heating coil 12(c).

Figure 9C:
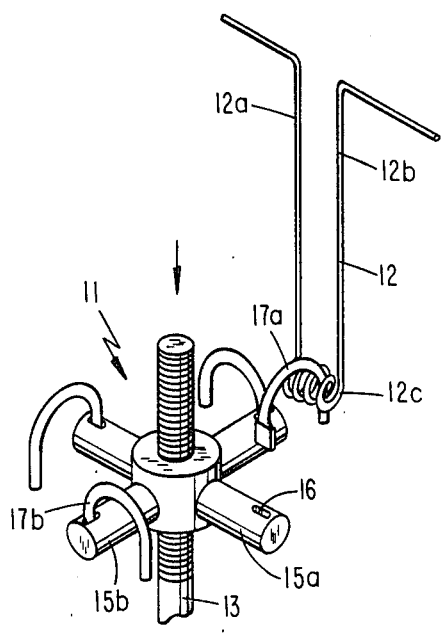

Rod 13 is then lowered so that the replenishment element 17(a), being an inverted U-shaped or hook-shaped element, is actually physically caught on the heating element coil 12(c) and lifted out of slot 16 as shown in FIG. 9(c).

Figure 9D:
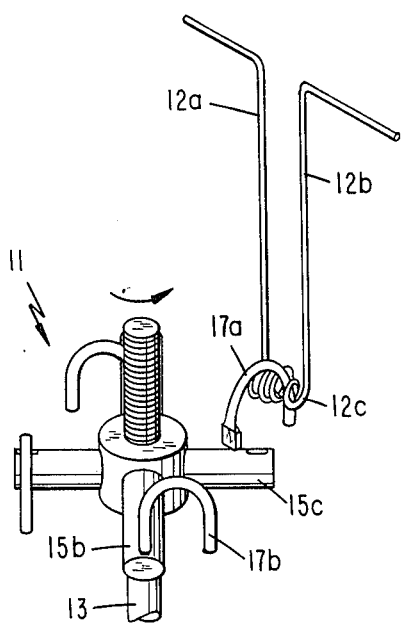

Rod 13 is then again rotated 45° in a counter-clockwise direction to the position shown in FIG. 9(d). With the wand apparatus in a lowered position away from heating element 12(c), the heating element may be activated, thereby melting and vaporizing the material 17(a) carried thereon. As those skilled in the art will recognize, melting of such inverted U-shaped material elements must be done slowly so that the replenishment material will be "wicked" on to the heating element.

After the material element 17(a) has been expended and deposited on a suitable substrate (not shown), the wand apparatus 11 is in a position to repeat the operation by subsequently raising the rod 13 and then rotating element 17(b) into position over the heating element 12(c). The device may then be lowered so that element 17(b) is then picked off by heating element 12(c) and the process repeated. It can be seen that this operation can be carried out in succession until all of the material source elements 17 have been expended in the vapor deposition process.

It is noted also that the material source elements 17(a), (b), (c), and (d) may be of different materials so that successive layers of this material may be deposited on the substrate. After all of the material elements 17 have been expended, only then is it necessary to break the vacuum in order to resupply the arms 15 with new source material elements 17.

Referring now to FIGS. 2 through 6, the motion producing apparatus 59 comprises a top plate 20 and a bottom plate 21 which are separated by three spaced-apart pillar posts 22. A drive shaft 23 passing through a vacuum feedthrough in the wall of the vacuum chamber 64 is connected to drive and control apparatus 61. Drive shaft 23 is keyed to drive gear 24 which meshes with intermediate gear 25 carried on intermediate shaft 26. Intermediate gear 25 meshes externally with cam gear 27 which is mounted on hollow shaft 28 that rotates about the sam axis as wand 13. Rotation of drive shaft 23 thus produces a rotation of cam gear 27 resulting in a rotary motion of the cylindrical or circumferential cam 29 mounted thereon.

The three pillar posts 22 (FIG. 3) are adjacent the outer periphery of bottom plate 21. Bearing block 30 is supported by four short pillars thereunder located directly below the block, fixed by screws 31. Bearing block 30 provides the top support for intermediate shaft 26 and the bottom support for a second intermediate shaft 32, as best seen in FIG. 2.

Figure 4:
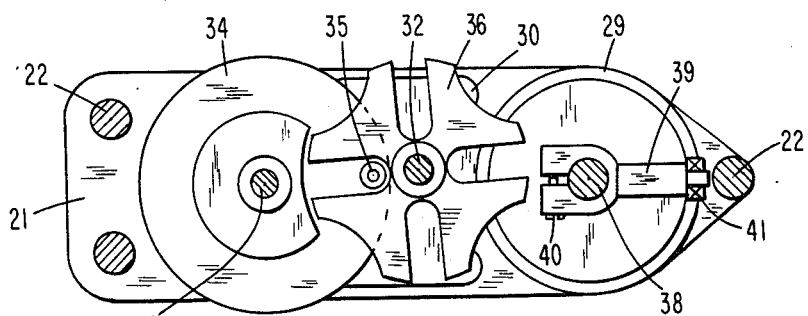
Figure 5:
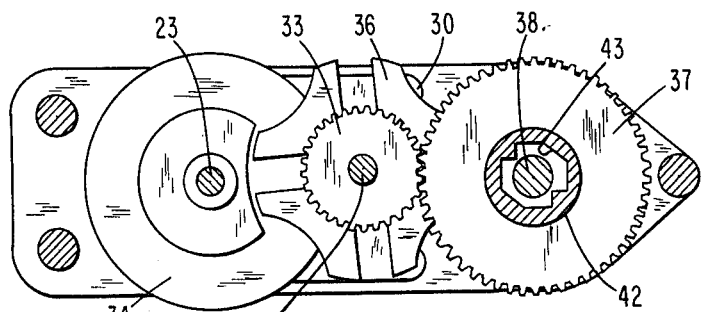

Shaft 23, keyed to gear 24, is also keyed at its upper end to a Geneva driver wheel 34. As best seen in FIG. 4, Geneva driver wheel 34 has a driving post 35 which engages the four slots in Geneva follower 36 mounted on the second intermediate shaft 32. Each rotation of shaft 23 and Geneva driver wheel 34, therefore, produces an intermittent one-fourth turn of second intermediate shaft 32 and Geneva follower 36. Also, keyed to intermediate shaft 32 above the Geneva follower 36 is an intermediate gear 33 (FIG. 5), which engages externally with a rotator gear 37 that rotates about the same axis as wand rod 13 and cylindrical cam 29. As is best seen in FIG. 5, gear 33 is selected to have a diameter equal to one-half the diameter of rotator gear 37. This gear ratio, coupled with the fact that each rotation of drive shaft 23 through the Geneva driver wheel 34 produces a 90° turning of the Geneva follower 36 keyed to shaft 32 and to intermediate gear 33, results in a drive sequence such that each rotation of drive shaft 23 causes a 45° turning of rotator gear 37.

Figure 6:
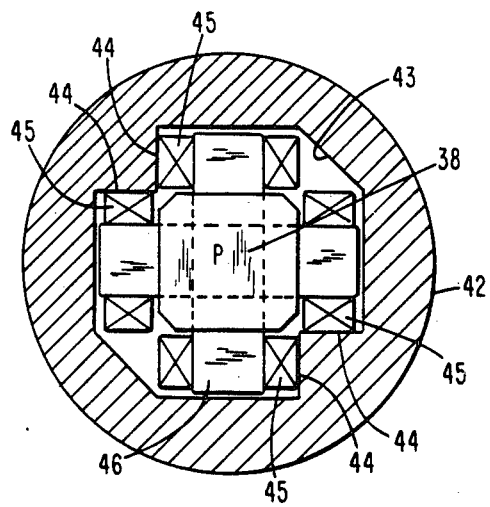

Rotator gear 37 is mounted concentrically on a hollow hub 42 which has an internal profiled bore 43, best seen in FIG. 6. A plunger 38, coaxial with the same axis as wand rod 13 and cylindrical cam 29, is carried by roller bearings 45 that roll on tracks 44 of bore 43 inside hollow hub 42. The roller bearings 45 are mounted via pins 46 to the plunger 38. This bearing configuration provides full axial motion in a vertical direction by plunger 38, while limiting its rotation to only that which is provided by the rotator hub 42.

Figure 2:
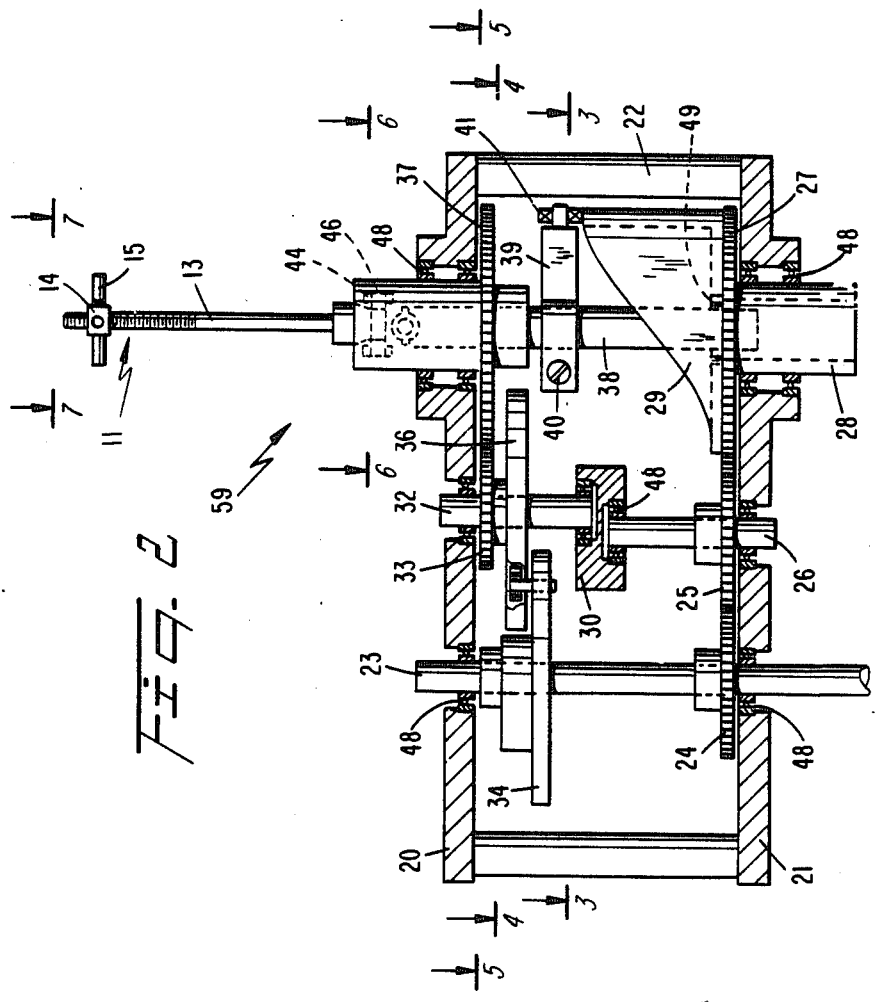
FIG. 2 is a vertical partial cross-sectional view of the apparatus of the invention.

Both linear and rotational motions of plunger 38, with respect to the cylindrical cam 29 located coaxially below, are made possible even under hard vacuum conditions by a carefully selected and sized silver bushing 49 located in the bottom of the cam assembly within cam gear 27, as best seen in FIG. 2. The vertically guided linear motion of plunger 38 is obtained via a cam follower 39 through a roller bearing 41 which is maintained in contact with cylindrical cam 29. Cam follower 39 is clamped to plunger 38 by means of a screw 40. A compression spring (not shown) is positioned axially between cam follower 39 and rotator gear 37, so as to provide the necessary biasing and restoring force maintaining contact between roller bearing 41 and the profile of cylindrical cam 29 at all times.

Both plunger 38 and cam 29 rotate about the same axis and in the same direction, as shown in FIGS. 2-5. As was pointed out earlier, one complete rotation of drive shaft 23 results in a 45° rotation of plunger 38 because of the nature of the Geneva drive mechanism (FIG. 4). As is clear from FIG. 2, it is necessary that the cam 29 rotate through 180° with respect to the plunger 38 (keyed to cam follower 39) for plunger 38 to experience a full vertical motion within its range. It therefore becomes necessary for cam 29 to rotate 180° plus an additional 45° to maintain the correct phase relationship between cam follower 39 and the contact surface of cylindrical cam 29. Thus the gear ratio between cam gear 27 and drive gear 24 has to be 1.6 to 1.0 so that each full turn of drive shaft 23 results in a ⅝ turn of the cam 29.

During operation of the mechanism, therefore, two complete turns of drive shaft 23 are required for one cycle of operation, i.e., the placement of a single replenishment source material element 17 onto heating coil 12. With correct phasing, cam follower 39 will be at a position corresponding to the lowest point of cam 29 when the Geneva driver post 35 is at its fully engaged position. Then, as drive shaft 23 is rotated, cam 29 and cam follower 39 will rotate together by 22.5° until the Geneva driver post 35 disengages from Geneva follower 36, whereupon the Geneva follower 36 becomes locked and prevented from further rotation. Cam 29, however, continues to rotate, and plunger 38 begins its linear excursion which is essentially completed at the moment that the Geneva driver post 35 reengages the Geneva follower 36 in the next sequential slot. Once again, cam 29 and cam follower 39 (which is associated with plunger 38) rotate together, while plunger 38 is at its maximum vertical extension. After the 45° rotation of plunger 38, the Geneva driver post 35 again disengages from and locks in position Geneva follower 36. Plunger 38 now begins its linearly downward retreat, controlled by the continued rotation of cam 29 contacted by roller bearing 41 on cam follower 39. By appropriate selection of the orientation of collar 14 on wand rod 13 (carrying replenishment source material elements 17) with respect to heating element 12, the above described motions will result in one replenishment source material element 17 being picked off by heating element 12 as indicated in FIG. 9(c). Completion of the above described operation occurs when cam follower 39 reaches its lowest point with respect to cam 29 and the Geneva driver post 35 is fully engaged in one of the slots of Geneva follower 36 while the plunger 38 and associated wand rod 13 are at the halfway point in their third 45° rotational motion.

The above procedure was described in detail for a Geneva mechanism provided with a four slotted Geneva follower 36. Persons reasonably skilled in the art will immediately recognize that other alternatives and other numbers of slots are possible and may, under appropriate circumstances, be preferable.

For correct operation of the entire system and to obtain the full benefit of the disclosed replenishment apparatus as part of the layer vacuum deposition system as a whole it will, of course, be necessary to coordinate control of the current to heating element 12 with the above described procedure.

It will be understood by persons skilled in the art that while the above description describes the intended purpose of the mechanism in principle, the entire apparatus, except for the drive and control means 61, must work inside a vacuum chamber under conditions of high vacuum and in the presence of vaporized metal atoms without seizing at sliding and contacting surfaces and without contaminating the system. Experience indicates that Type 304 stainless steel is a satisfactory material for all components except the plunger, specifically including the support plates, pillars, bearing block, control arm, rotator, and the cam itself. The shafting, gears, gear clamps, and the Geneva mechanism were also made from Type 304 stainless steel and have been found to work satisfactorily.

To allow for an alternative embodiment in which the replenishment source material pieces may be melted off from the wand support onto electrically conducting heating element 12, plunger 38 is preferably made from Kovar so that an alumina insulator can be brazed between the plunger 38 and wand 13. Doing this would provide electrical insulation of wand 13 from plunger 38 so that, if desired, source replenishment can take place by melting metal pieces supported by the wand directly onto electrically conducting heating element 12. The spring (not shown for simplicity) used to bias the cam follower 39 towards cam 29 may preferably be formed from Type 302 stainless steel. (Precision ABEC-7) 440C stainless steel roller bearings are found satisfactory for use to support shafts 23, 26, 32, 42, and 28 and rollers 41 and 44. Copper-beryllium keepers for the cam bearings and rotator hub bearings are preferable since commonly used fiber keepers are not satisfactory under high vacuum conditions.

All bearings are disassembled, cleaned and degreased and their balls silver-plated to a thickness of 0.00005 inches and reassembled before they are pressed into their respective housings.

The Geneva follower 36, and the gears situated on intermediate shafts 26 and 32, are gold-plated. These last two steps ensured that the gears and the roller bearings do not stick or gall during high vacuum operation.

Cam 29 has a sinusoidal configuration; however, it is necessary to provide a flat at its peak, extending for about ±20° from the diameter of symmetry. This ensures that cam follower 39 reaches the top of the cam before the Geneva mechanism unlocks. Without this provision, the Geneva mechanism has a tendency to bind just as it unlocks, due to the torque produced on the cam follower 39 by the sloping part of the cam when the return spring is under maximum compression.

Correct phasing of the replenishment source material delivery mechanism, as described above, requires that cam follower 39 be positioned at the lowest point on the cam 29 when the Geneva driver post 35 is fully engaged. This phase relationship can be easily adjusted without unclamping the cam follower 39 from plunger 38. It is accomplished by moving the rotator assembly along plunger 38 toward cam follower 39 until rotator gear 37 is disengaged from its drive gear 33. With the Geneva driver post 35 fully engaged in follower 36, the rotator assembly is then rotated to position cam follower 39 at the lowest point of the cam, at which position the rotator gear 37 and its drive gear 33 are reengaged.

Completely satisfactory experiments have been performed using the above described mechanism to provide replenishment metal in the form of gold wire of 0.04 inch diameter cut into 0.60 inch lengths and formed into a generally U-shape as shown in FIG. 8. One end of each of the U-shaped elements 17 was flattened by means of a vice having polished faces s that it could be inserted into the elongated apertures 16 machined in arms 15. In this manner, the shoulder formed at the end of the flattened portion of each replacement source material element 17 rests on the top surface of the arm 15, while the flattened portion 19 maintains the proper orientation of the element with respect to the arm 15 as best seen in FIG. 7.

Persons skilled in the art will readily recognize that other materials and particular operational conditions of vacuum and temperature, as well as factors such as the nature of the substrate on which the vacuum deposition of material is to be obtained, the thickness of the film desired, and the like, may require minor adjustments to the size, the shape and the operation of the mechanism discussed above.

It should be apparent from the preceding that the invention may be practiced otherwise than as specifically described and disclosed herein. Modifications may, therefore, be made to the specific embodiments disclosed herein without departing from the scope of this invention, and all such modifications are intended to be included within the claims appended below.

What is claimed is:

1. A mechanism for providing replenishing source material to a heating element for vaporizing said source material within a vacuum chamber of a vacuum deposition apparatus, comprising:
   (a) vertically disposed moveable support means having an upper and a lower end and located within the vacuum chamber for movably supporting a plurality of source material elements adjacent said heating element at said upper end thereof;
   (b) motion producing means located within the vacuum chamber and operably connected to the moveable support means for producing intermittent motion of sid moveable support means for moving said source material elements supported thereby, one material at a time, into contact with said heating element and having
      (1) means for imparting to said support means both linear motion along a predetermined first axis and rotary motion about said first axis of said support means,
      (2) a circumferentially disposed cylindrical cam having a predetermined cam profile, disposed for rotation about said first axis, and
      (3) cam follower means connected to said movable support means for following said cam profile, to thereby generate said linear motion of said moveable support means;
   (c) drive means located outside the vacuum chamber for controlling operating said motion producing means outside said vacuum chamber; and
   (d) first gearing means operably connected between said cylindrical cam and said drive means and second gearing means operably connected between said moveable support means and said drive means, to thereby generate said rotary motion of said moveable support means.

2. A mechanism according to claim 1, wherein said motion producing means further comprises:

a Geneva drive, coupled to said second gearing means, to generate said intermittency of motion.

3. A mechanism according to claim 1, wherein:
at least two of said plurality of source material elements are comprised of different substances, whereby said vaporizing of said source material comprising different materials provides sequential deposits of said different materials.

4. A mechanism according to claim 1, wherein said moveable support means comprises:
(1) a vertically disposed rod having an upper end and a lower end;
(2) a collar positioned vertically on said upper end of said rod; and
(3) a plurality of outwardly extending radially spaced arm members, each of said arm members having a first end adjacent and secured to said collar and a second, distal end having a vertically disposed aperture for carrying one of said material source replenishment elements.

5. A mechanism according to claim 4, wherein each of said source material elements comprises an inverted U-shaped rod of a desired material having a first end shaped and sized for being slidably inserted into said aperture of one of said arm members, whereby said source material element may be removably carried without rotation by said arm member.

6. A mechanism according to claim 1, wherein said drive means comprises an external drive motor and control mechanism operably connected to said motion producing apparatus by means of a drive shaft extending through said vacuum chamber by means of a vacuum seal.

7. A mechanism according to claim 1, wherein said second gearing means comprises:
(a) a hollow hub having an internal profiled bore with internal tracks extending therethrough;
(b) a rotator gear mounted concentrically on said hollow hub;
(c) an intermediate gear engaged externally with said rotator gear and having a preselected diameter proportional to the diameter of said rotor gear;
(d) a plunger coaxial with said movable support means and said cylindrical cam and operably connected to said cam follower means; and
(e) a bearing configuration operably connected for carrying said plunger, comprising first roller bearings capable of rolling on said internal tracks of said bore.

8. A mechanism according to claim 7, wherein said plunger is operably connected to said cam follower means and a second roller bearing operably connected to said cylindrical cam, for providing vertically guided linear motion.

9. A mechanism according to claim 1, wherein said predetermined cam profile is a sinusoidal curve with a flat at the peak of said curve.

10. A mechanism according to claim 9, wherein said flat extends for about ±20° from the diameter of symmetry.

* * * * *